US006720759B2

(12) United States Patent
Taylor

(10) Patent No.: US 6,720,759 B2
(45) Date of Patent: Apr. 13, 2004

(54) MICRO-TOOLS

(75) Inventor: James E. Taylor, Enosburg Falls, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/681,999

(22) Filed: Jul. 6, 2001

(65) Prior Publication Data

US 2003/0006755 A1 Jan. 9, 2003

(51) Int. Cl.[7] .................................................. G01R 1/06
(52) U.S. Cl. ...................................................... 324/149
(58) Field of Search ............................... 324/149, 76.11, 324/72–5; 219/121.6, 121.73

(56) References Cited

U.S. PATENT DOCUMENTS

| 740,506 A | 10/1903 | Winquist et al. ............. 144/219 |
| 3,995,619 A | 12/1976 | Glatzer ........................ 600/550 |
| 4,100,393 A | 7/1978 | Luther .................... 219/121.71 |
| 4,700,043 A | 10/1987 | Matsutani ............... 219/121.69 |
| 5,312,422 A | 5/1994 | Trott ........................... 606/144 |
| 5,414,236 A | 5/1995 | Couch, Jr. et al. ...... 219/121.39 |
| 5,425,903 A | 6/1995 | Sloane, Jr. et al. .......... 264/400 |
| 5,478,328 A | 12/1995 | Silverman et al. ........... 604/272 |
| 5,515,871 A | 5/1996 | Bittner et al. ................ 128/898 |
| 5,582,749 A | 12/1996 | Mori et al. ............. 219/121.84 |
| 5,653,896 A | 8/1997 | Couch, Jr. et al. ...... 219/121.44 |
| 5,744,780 A | 4/1998 | Chang et al. ........... 219/121.73 |
| 5,747,770 A | 5/1998 | Bogart .................... 219/121.72 |
| 5,807,304 A | 9/1998 | Cockburn ..................... 604/19 |

OTHER PUBLICATIONS

Integrated Micro Endeffector for Dexterous Micromanipulation Aral, F., et al. Micro Machine and Human Science, 1996, Proceedings of the Seventh International Symposium, 1996 pp. 149–156.
Micro Endeffector with Micro Pyramids and Integrated Piezoresistive Force Sensor Aral, F., et al. Intelligent Robots and Systems '96, IROS 96, Proceedings of the 1996 IEEE/RSJ International Conference on vol. 2, 1996 pp. 842–849 vol. 2.

*Primary Examiner*—Michael Nghiem
(74) *Attorney, Agent, or Firm*—Anthony J. Canale

(57) ABSTRACT

A micro tool set is described in which all of the tools are formed from stock no larger than 1.0 mm in diameter. Each tool is laser machined from stock no larger than 1.0 micron in diameter. Various shapes are "carved" from the original stock such that the finished tool does not extend beyond the nominal cylindrical shape of the stock. The tools are specifically adapted to be used for the repair of semiconductor test probe head wires.

8 Claims, 1 Drawing Sheet

MICRO-TOOLS

BACKGROUND OF THE INVENTION

This invention relates to probe cards for testing semiconductor devices and particularly to tools used to align micro probes to be in a desired location for proper probing and testing.

With the increased complexity of semiconductor devices, the testing and capability to provide test probe assemblies has become more complex. As the number of input/output increased, the size and pitch of probable pads continues to decrease.

While it is true that many of the operations used in the manufacturing of semiconductors have been automated and/or are capable of being accomplished by robots, the job of aligning probes remains a manual operation. With the aid of a microscope and tiny manipulative tools such as sold by organizations like Electron Microscopy Sciences, 321 Morris Road, Fort Washington, Pa., 19034 (see also their World wide Web site). These tools come in various nominal tip sizes from 0.12 mm to 0.50 mm diameter. The tips are available in over 32 different configurations and resemble miniature dental instruments, a purpose for which many were designed. Many of the tools are merely tubular structures bent to provide access for probing various trypes specimens.

While these prior art tools may be "the smallest known precision tools available for the laboratory and micro electronics industry," they have not been developed for th especific purpose of adjusting micro probes in a testing environment.

SUMMARY OF THE INVENTION

In is an object of the invention to provide a set of tools specifically designed for repair and alignment of microprobe test heads.

It is another object of the invention to provide micro-tools carved from cylinders of stainless steel such that no part of the tool exceeds the boundary of the nominal diameter of the starting cylinder.

The tools and method of the invention provide for extremely small tools, many times smaller than those, above, boasted as the "smallest known.

These and other object of the invention will become apparent to those skilled in the art when considered in light of the accompanying drawings.

DESCRIPTION OF THE PREFERRED EMBODIMENT

This invention relates to ultra-miniature tools specifically designed to facilitate the alignment and repair of wire probe assemblies for testing semiconductor devices. Each of the tools of the invention is formed from a single cylindrical solid or hollow shaft and, as such, each tool is confined to be of no larger dimension than the initial starting cylinder.

The probe assemblies consist of several, up to hundreds, of very thin wire probes, each of which is required to be positioned within a very small space in order for all of the probes in an assembly to make proper contact with corresponding input/output pads on a semiconductor device. During use the probes become misaligned and bent and must be inspected and repaired before the probe assembly can be reused.

Probe head repair persons, with the aid of a microscope, must be able to manually bend, manipulate and position probes into their proper position. This job is accomplished through the use of miniature tools capable of working on individual probe wires.

This invention describes a set of tool in which each has been invented to serve a specific function in the process of probe head repair.

Figure 1:
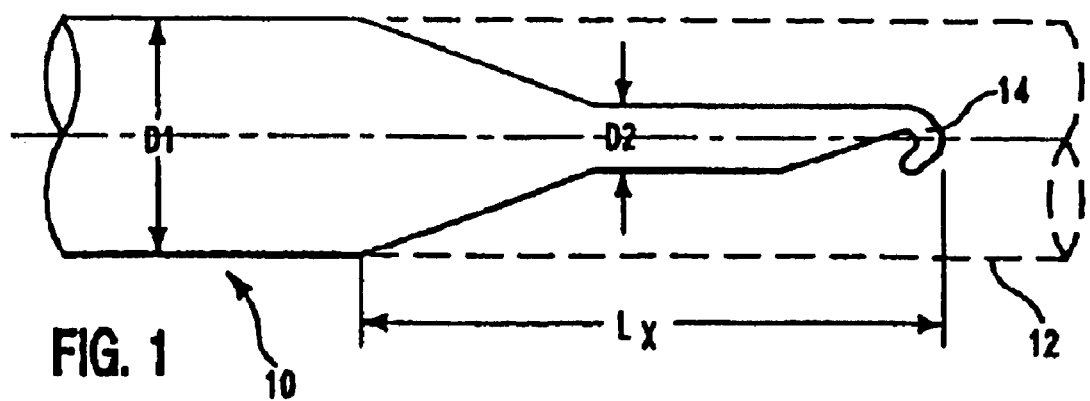
FIG. 1 is a side view of one of the tools of the invention, showing a hooked end used to pull objects toward the handle.

Referring now to FIG. 1, there is shown a "puller" tool 10 developed to pull wires toward the repair person. Puller tool 10 is cut from a cylindrical solid stainless steel rod 12 which has been cut and shaped by a laser such as a copper vapor laser or a frequency doubled ND:YAG laser, as described in U.S. Pat. No. 5,744,780, issued Apr. 28, 1998 to J. J. Chang et al., herein incorporated in its entirety by reference, in which the size of the laser beam can be adjusted to less than one micron. Other relevant references to laser machining can be found in U.S. Pat. Nos. 5,380,976, issued Jan. 10, 1995, to Couch, Jr. et al., 5,425,903, issued Jun. 20, 1995 to Sloane, Jr. et al., and 5,582,749, issued Dec. 10, 1996 to A. Mori et al., all describing various aspects of laser machining.

The template of the puller tool shown in FIG. 1, is a solid cylinder 12 of stainless steel having a nominal minor dimension or diameter D1 of 0.42 mm and a machined tip length Lx of 1.00 mm. Part way up the tip, the diameter of the shaft is reduced to a second diameter D2 of about 0.08 mm. At the terminal end of the tool 10 a recursive tip is formed such that a hook 14 having a thickness of about 0.04 mm is formed such that wires having a diameter of about 0.04 mm can be pulled using the hook 14. Note that the entire structure of the tool tip is "carved" from the nominal cylinder 12 of a solid wire, as shown by the reference 12.

Figure 2:
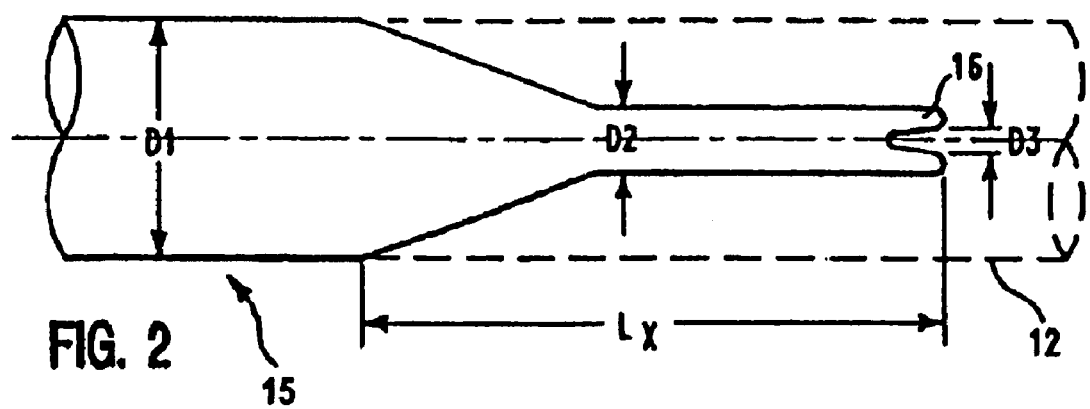
FIG. 2 is a side view of another tool of the invention, showing a notched end used to push objects away from the handle.

Referring to FIG. 2 there is shown another variation of the tool. Here the function of the tool 15 is as a "pusher" and the tip 16 of the tool 15 is defined to facilitate the pushing of a probe wire away from the user. The starting material for the pusher tool 15 is the same as that used for the puller tool 10 of FIG. 1 and includes the nominal shaft having a diameter D1 of 0.42 mm and a second diameter D2 fo 0.08 mm. The tip 16 of the pusher tool 15 is shaped like a fork to prevent the wire being pushed from slipping off of the tool. The size of the forked portion of tip 16 of the tool 15 is about 0.04 mm wide and about 0.25 mm deep.

Figure 3:
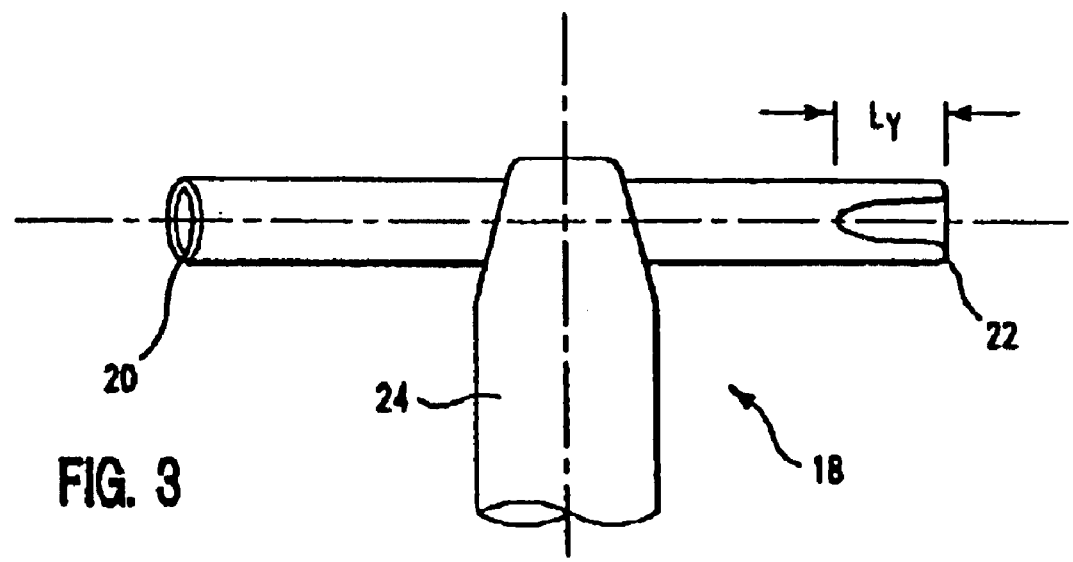
FIG. 3 is a side view of a two headed tool, showing and open "socket" and a "grabbing end mounted on a single handle.

FIG. 3 shows yet another variation of the micro tools of the invention designated the "tee" tool in that the working end is shaped like the letter "tee" and has two working tips 20 and 22. The tool tips are mounted in a handle 24 which allows the tool to be manipulated in working with the wires of the probe head being repaired. The working tips of the tool 18 are fabricated from a piece of stainless steel needle stock about 0.27 mm in diameter having a bore of about 0.19 mm mounted orthogonally to the handle. The tool tip 20 allows the bending or straightening of a probe wire by being inserting the wire into the inner bore and bending the wire to the desired position. The other tip 22 of the tool 18 is shaped by forming a beveled slice across the end of the tip having a length Ly of about 0.6 mm. This end of the tool can be conveniently used after bending of a probe wire to position the wire in the exact position needed.

As can be seen, each of the tools of the invention can be fabricated from a single piece of cylindrical stock such that no portion of the tool tip extends beyond the minor dimention a projection of the original stock piece. Unlike the manipulating tools of the prior art, each tool in its final form remains no larger than the size of the stock. Such that all of the tools are of a maximum size of a nominal sub-micron size.

While the invention has been described in terms of limited specific embodiments, those skilled in the art will realize that other tip shapes may be machined or formed from a common stock piece without exceeding the nominal stock cylindrical space.

What is claimed is:

1. A set of micro manipulative tools, each of which is formed from a stock member, said set of micro manipulative tools comprising:

a stock member having a first minor dimension having a maximum width of less than one millimeter and an end including a first portion having the first minor dimension and a second portion formed at said end, the second portion formed of and within the extension of the first minor dimension of the stock member having a second minor dimension less than the first minor dimension;

a first tool formed from the stock member having a hooked tip formed at the terminal end of the second portion and within the extension of the second minor dimension to facilitate the pulling of an object toward a user of the tool; and a second tool formed from the stock member having a forked tip formed at the terminal end of the second portion and within the extension of the second minor dimension to facilitate the pushing of an object away from a user of the tool.

2. The set of micro manipulative tools of claim 1 wherein said stock member is a cylinder having a diameter of less than one millimeter.

3. The set of micro manipulative tools of claim 2 wherein said stock is stainless steel.

4. The set of micro manipulative tools of claim 2 wherein said fast tool comprises a tip including a hook formed in said stock member.

5. The set of micro manipulative tools of claim 1 further comprising a third tool comprising:

a handle for supporting a stock member including two tips, mounted orthogonally to the handle;

said first tip comprising a hollow cylinder; and said second tip comprising a beveled hollow cylinder.

6. A method of fabricating micro manipulative tools comprising the steps of:

providing a piece of stock having a first minor dimension having a maximum width of less than one millimeter and an end including a first portion having the first minor dimension; and laser machining said first portion to form a second portion at said end, the second portion formed of and within the extension of the first minor dimension of the stock having a second minor dimension less than the first minor dimension and a tip formed at the terminal end of the second portion and entirely within an extension of said second minor dimension and wherein at least one tip is in the shape of a hook.

7. The method of claim 6 wherein said stock is cylindrical in shape.

8. The method of claim 7 wherein said stock is stainless steel.

* * * * *